(12) United States Patent
Kadous et al.

(10) Patent No.: US 8,331,892 B2
(45) Date of Patent: Dec. 11, 2012

(54) METHOD AND SYSTEM FOR DC COMPENSATION AND AGC

(75) Inventors: Tamer A. Kadous, San Diego, CA (US); Iwen Yao, San Diego, CA (US); Jibing Wang, San Diego, CA (US); Weihong Jing, San Diego, CA (US); Yong Li, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 695 days.

(21) Appl. No.: 12/398,285

(22) Filed: Mar. 5, 2009

(65) Prior Publication Data

US 2010/0184397 A1 Jul. 22, 2010

Related U.S. Application Data

(60) Provisional application No. 61/040,663, filed on Mar. 29, 2008.

(51) Int. Cl.
*H04B 1/10* (2006.01)
(52) U.S. Cl. ................................. 455/234.1; 455/296
(58) Field of Classification Search .............. 455/312, 455/232.1, 324, 266, 296, 245.1, 305
See application file for complete search history.

(56) References Cited

U.S. PATENT DOCUMENTS

| | | | |
|---|---|---|---|
| 5,754,595 | A | 5/1998 | Honkasalo et al. |
| 6,327,313 | B1 * | 12/2001 | Traylor et al. ............... 375/316 |
| 6,985,711 | B2 * | 1/2006 | Holenstein et al. ........... 455/312 |
| 7,174,190 | B2 * | 2/2007 | Walker et al. ............... 455/557 |
| 2002/0160734 | A1 * | 10/2002 | Li et al. ..................... 455/245.1 |
| 2004/0043744 | A1 | 3/2004 | Schlegel et al. |

FOREIGN PATENT DOCUMENTS

| | | |
|---|---|---|
| JP | 2001180835 A | 7/2001 |
| JP | 2005507568 | 3/2005 |
| JP | 2005130203 A | 5/2005 |
| JP | 2005524272 A | 8/2005 |

(Continued)

OTHER PUBLICATIONS

International Search Report & Written Opinion—PCT/US2009/036585, International Search Authority—European Patent Office—Jul. 6, 2009.

(Continued)

*Primary Examiner* — Dinh T. Le
(74) *Attorney, Agent, or Firm* — Larry Moskowitz; Abdollah Katbab

(57) ABSTRACT

A technique for performing AGC and DC compensation in a receiver. The receiver comprises an energy estimator for generating an estimate of the level of a received signal; an RF device to apply gain to the received signal; an AGC for controlling the RF device gain based on the energy estimation; a first DC compensation loop for finely adjusting the DC component of the received signal in fast or slow tracking mode (FTM or STM); and a second DC compensation loop for coarsely adjusting the DC component of the received signal. Three modes of AGC operations: In Acquisition, iterations of FTM fine DC adjustment, short energy estimation, and RF device gain adjustment are performed during signal timing detection. In Connected, long energy estimation, RF device gain adjustment, and STM fine and coarse DC adjustments are performed during superframe preamble. In Sleep, FTM fine DC adjustment, short energy estimation, and RF device gain adjustment are performed during superframe preamble.

28 Claims, 9 Drawing Sheets

FOREIGN PATENT DOCUMENTS

| | | |
|---|---|---|
| JP | 2009544251 A | 12/2009 |
| KR | 20030084933 | 11/2003 |
| RU | 2142205 | 11/1999 |
| RU | 2241310 C2 | 11/2004 |
| WO | WO9620540 A2 | 7/1996 |
| WO | WO0045523 A2 | 8/2000 |
| WO | WO02067420 | 8/2002 |
| WO | WO2007118101 | 10/2007 |

OTHER PUBLICATIONS

Taiwan Search Report—TW098108790—TIPO—Mar. 10, 2012.

* cited by examiner

US 8,331,892 B2

METHOD AND SYSTEM FOR DC COMPENSATION AND AGC

CROSS-REFERENCE TO A RELATED APPLICATION

This application claims the benefit of the filing date of Provisional Application Ser. No. 61/040,663, filed on Mar. 29, 2008, and entitled "Method and System for DC Compensation and AGC," which is incorporated herein by reference.

FIELD

This disclosure relates generally to a system and method for automatic gain control (AGC) and direct current (DC) voltage compensation in a front-end radio frequency (RF) receiver system.

BACKGROUND

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP LTE systems, and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out (SISO) system, multiple-in-signal-out (MISO) system, or a multiple-in-multiple-out (MIMO) system.

A MIMO system employs multiple ($N_T$) transmit antennas and multiple ($N_R$) receive antennas for data transmission. A MIMO channel formed by the $N_T$ transmit and $N_R$ receive antennas may be decomposed into $N_S$ independent channels, which are also referred to as spatial channels, where $N_S \leq \min\{N_T, N_R\}$. Each of the $N_S$ independent channels corresponds to a dimension. The MIMO system can provide improved performance (e.g., higher throughput and/or greater reliability) if the additional dimensionalities created by the multiple transmit and receive antennas are utilized.

A MIMO system supports a time division duplex (TDD) and frequency division duplex (FDD) systems. In a TDD system, the forward and reverse link transmissions are on the same frequency region so that the reciprocity principle allows the estimation of the forward link channel from the reverse link channel. This enables the access point (AP) to extract transmit beam forming gain on the forward link when multiple antennas are available at the access point (AP).

In such systems, the signal at a receiver, such as the receiver of a wireless access terminal (AT), may vary substantially in power level due to a number of factors, including transmit power, mobility, multipath, fading, interference and others. At such receiver, the received signal is typically amplified by a low noise amplifier (LNA), down-converted to a lower frequency range by a mixer-local oscillator (LO) combination, and converted into digital format by an analog-to-digital converter (ADC). In order to properly or optimally convert the signal into digital format, the average signal power level at the input of the ADC should be large enough that the quantization-to-noise ratio is sufficiently large to properly quantized the received signal with minimal noise, and small enough to prevent saturation of the ADC. Thus, in order to properly set the signal power level at the input of the ADC, typically such receivers employ automatic gain control (AGC) to adjust the gain of a device upstream from the ADC.

Another issue that arises in such receivers is the DC level produced at the output of the downconverting mixer and other devices downstream thereof. The DC level is mainly produced by the LO signal leaking towards the input, and then re-mixing with the LO signal again to produce the DC level. Generally, the DC level adversely affects the estimation of the received signal power level performed downstream. This estimation is performed to properly set the gain of the LNA as well as a digital gain stage further downstream.

Generally, the AGC of the LNA or mixer gain and the DC level are not independent of each other. For example, changing the gain of the LNA or mixer often causes the DC level to change as well. Thus, there is a need for a technique to perform AGC and DC level compensation in a combined fashion to ensure proper signal level at the input of the ADC, as well as a reduction or elimination of the DC level downstream of the mixer.

SUMMARY

An aspect of the disclosure relates to an apparatus and method for providing automatic gain control (AGC) and direct current (DC) compensation in a receiver. In this regard, the receiver comprises an energy estimator for generating an energy estimate of the signal level of a received radio frequency (RF) signal; an RF device (e.g., a low noise amplifier (LNA) or mixer) to apply a programmable gain to the received RF signal; an AGC module for controlling the gain of the RF device based on the energy estimation of the received RF signal, a fine DC compensation loop for adjusting the DC component of the received signal in a fine manner; and a coarse DC compensation loop for adjusting the DC component of the received signal in a coarse manner. At least three modes of operations are contemplated: Acquisition mode, Connected mode, and Sleep mode.

In the Acquisition mode, the signal is being received by the receiver, but timing information of the signal has not yet been detected. Acquisition mode may be applicable just after powering up an access terminal (AT). In this mode, an objective is to perform a reasonably accurate adjustment of the AGC of the received signal. This is accomplished by performing one or more iterations of the following: (1) a fine adjustment in a fast tracking mode (FTM) of the DC component of the received signal; (2) a relatively brief estimation of the energy of the received signal; and (3) an adjustment of the programmable gain of the RF device based on the brief energy estimation of the received signal.

In Connected mode, the receiver has detected the timing information of the received signal. Accordingly, an objective is to perform a more accurate AGC of the received signal. This is accomplished by performing one or more iterations of the following: (1) a relatively lengthy estimation of the energy of the received signal; (2) an adjustment of the programmable gain of the RF device based on the lengthy energy estimation of the received signal; (3) a fine adjustment in a slow tracking mode (STM) of the DC component of the received signal; and (4) one or more coarse adjustments of the DC component of the received signal. If no adjustment of the programmable gain is performed in step (2), then steps (3) and (4) may be foregone, unless the fine DC component of the received signal is above a predetermined threshold.

In Sleep mode, the receiver is not receiving or transmitting traffic information, but is receiving a quick page signal from an access point (AP). The receiver wakes up (e.g., transitions from a low power mode to a high power mode) at a predetermined time to listen to the quick page signal (e.g., the second symbol of the Ultra Mobile Broadband (UMB) superframe preamble (SFPA)) to determine whether the access point (AP) has a message to send to the receiver. An objective is to perform a moderately accurate AGC of the received signal fast enough after waking up. This is accomplished by performing a predetermined number of iterations of the following at a predetermined timing relationship with the received signal: (1) a fine adjustment in FTM of the DC component of the received signal; (2) a relatively brief estimation of the energy of the received signal; and (3) an adjustment of the programmable gain of the RF device based on the brief energy estimation of the received signal.

Other aspects, advantages and novel features of the present disclosure will become apparent from the following detailed description of the disclosure when considered in conjunction with the accompanying drawings.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DESCRIPTION

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2). These various radio technologies and standards are known in the art. For clarity, certain aspects of the techniques are described below for LTE, and LTE terminology is used in much of the description below.

Single carrier frequency division multiple access (SC-FDMA), which utilizes single carrier modulation and frequency domain equalization is a technique. SC-FDMA has similar performance and essentially the same overall complexity as those of OFDMA system. SC-FDMA signal has lower peak-to-average power ratio (PAPR) because of its inherent single carrier structure. SC-FDMA has drawn great attention, especially in the uplink communications where lower PAPR greatly benefits the mobile terminal in terms of transmit power efficiency. It is currently a working assumption for uplink multiple access scheme in 3GPP Long Term Evolution (LTE), or Evolved UTRA.

Figure 1:
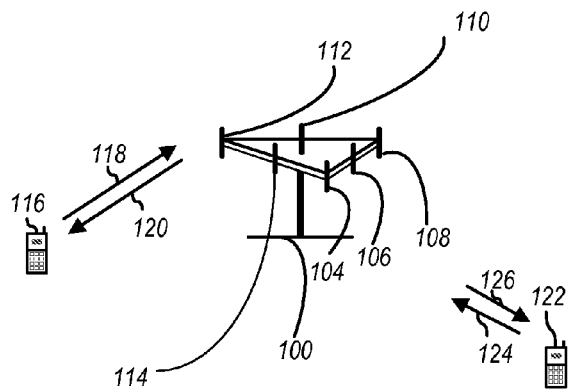
FIG. 1 illustrates an exemplary multiple access wireless communication system according to an aspect of the disclosure.

FIG. 1 illustrates an exemplary multiple access wireless communication system according to an aspect of the disclosure. An access point 100 (AP) includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over forward link 120 and receive information from access terminal 116 over reverse link 118. Access terminal (AT) 122 is in communication with antennas 106 and 108, where antennas 106 and 108 transmit information to access terminal (AT) 122 over forward link 126 and receive information from access terminal (AT) 122 over reverse link 124. In a FDD system, communication links 118, 120, 124 and 126 may use different frequency for communication. For example, forward link 120 may use a different frequency than that used by reverse link 118.

Each group of antennas and/or the area in which they are designed to communicate is often referred to as a sector of the access point (AP). In the embodiment, antenna groups each are designed to communicate to access terminals (ATs) in a sector of the areas covered by access point (AP) 100.

In communication over forward links 120 and 126, the transmitting antennas of access point (AP) 100 utilize beamforming in order to improve the signal-to-noise ratio of forward links for the different access terminals (ATs) 116 and 122. Also, an access point (AP) using beamforming to transmit to access terminals (ATs) scattered randomly through its coverage causes less interference to access terminals (ATs) in neighboring cells than an access point (AT) transmitting through a single antenna to all its access terminals (ATs).

An access point (AP) may be a fixed station used for communicating with the access terminals (ATs), and may also be referred to as an access point (AP), a Node B, a base station (BS), or some other terminology. An access terminal (AT) may also be called a user equipment (UE), a wireless communication device, a terminal, or some other terminology.

Figure 2:
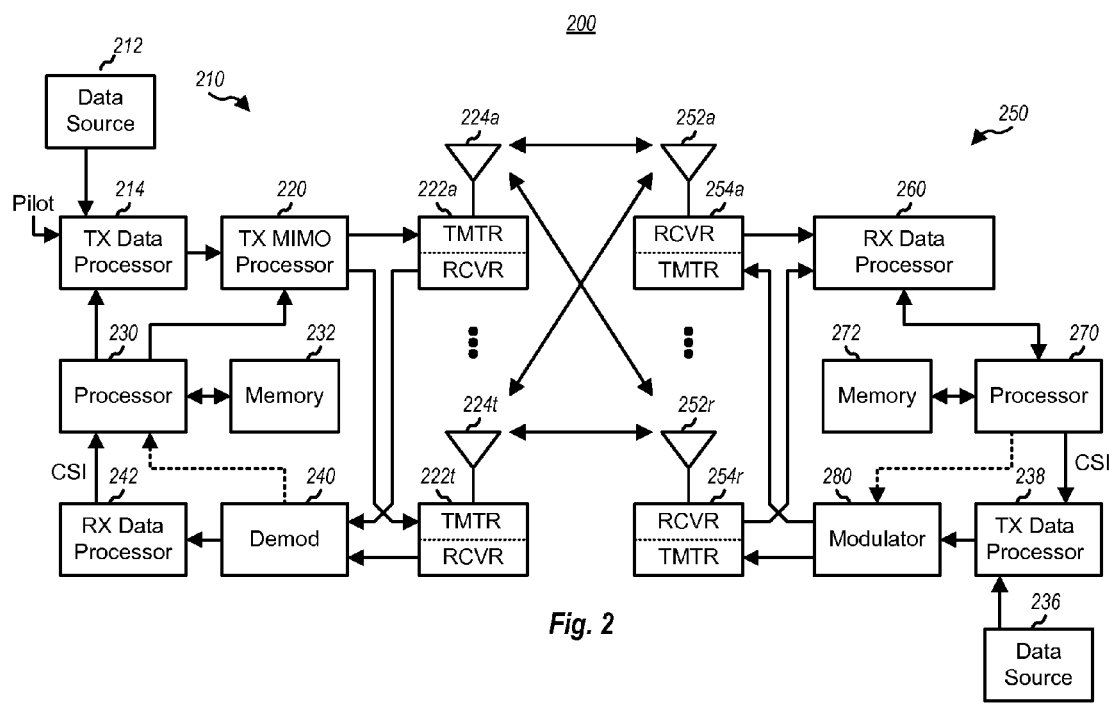
FIG. 2 illustrates a block diagram of an exemplary communication system according to another aspect of the disclosure.

FIG. 2 illustrates a block diagram of an exemplary communication system 200, such as a MIMO system, comprising a transmitter system 210 (also known as the access point (AP)) and a receiver system 250 (also known as the access terminal (AT)). At the transmitter system 210, traffic data for a number of data streams is provided from a data source 212 to a transmit (TX) data processor 214.

In an embodiment, each data stream is transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain embodiments, TX MIMO processor 220 applies beamforming weights to the symbols of the data streams and to the antenna from which the symbol is being transmitted.

Each transmitter 222a-t receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals are received by $N_R$ antennas 252a through 252r and the received signal from each antenna is provided to a respective receiver (RCVR) 254a through 254r. Each receiver 254a-r conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from $N_R$ receivers 254a-r based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion.

The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224a-t, conditioned by receivers 222a-t, demodulated by a demodulator 240, and processed by a RX data processor 242 to extract the reverse link message transmitted by the receiver system 250. Processor 230 then determines which pre-coding matrix to use for determining the beamforming weights then processes the extracted message.

Figure 3:
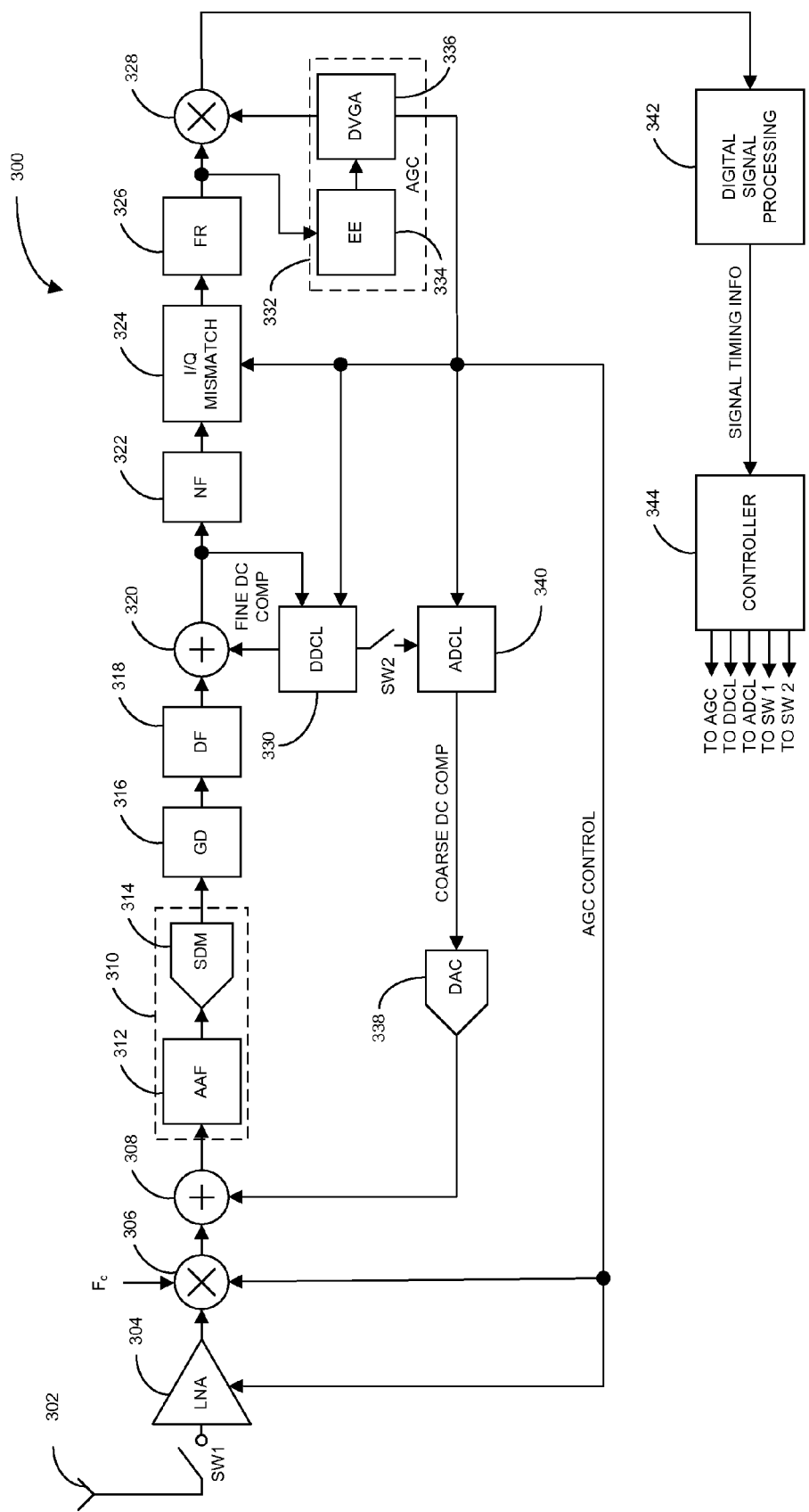
FIG. 3 illustrates a block diagram of an exemplary receiver front-end system including AGC/DC compensation control according to another aspect of the disclosure.

FIG. 3 illustrates a block diagram of an exemplary receiver front-end system 300 for performing automatic gain control (AGC) and DC compensation control according to another aspect of the disclosure. In the exemplary embodiment, the front-end system 300 is described herein as part of an access terminal (AT), and, for example, may be implemented in any one or more of the receivers 254a-r of access terminal (AT) 250, previously described. However, it shall be understood that the front-end system 300 may be implemented in any receiver, including any one or more of the receivers 222a-t of access point (AP) 210, previously described.

In particular, the front-end system 300 comprises an antenna 302, a first switch SW1, a low noise amplifier (LNA) 304, a mixer 306, a first summer 308, and an analog-to-digital converter (ADC) 310 comprising an anti-aliasing filter (AAF) 312 and a sigma-delta-modulator (SDM) 314. It shall be understood that components of the ADC 310 may be changed according to design preference. Additionally, the front-end system 300 comprises a group delay (GD) 316, a digital filter (DF) 318, a second summer 320, a notch filter (NF) 322, an I/Q mismatch compensating device 324, a frequency rotator (FR) 326, a digital gain module 328, a digital signal processing module 342, and a front-end controller 344. Further, the front-end system 300 comprises a digital DC correction loop (DDCL) 330, a second switch (SW2), an analog DC correction loop (ADCL) 340, a digital-to-analog converter (DAC) 338, and an automatic gain (AGC) module 332 comprising an energy estimator (EE) 334 and a digital variable gain amplifier (DVGA) 336.

In operation, the antenna 302 picks up a received RF signal from a wireless medium, and provides it to the LNA 304 by way of the first switch SW1 when it is in a closed position. The LNA 304, in turn, amplifies the received RF signal with a gain controlled by the AGC module 332. The amplified RF signal generated by the LNA 304 is applied to the mixer 306, which frequency down converts the received signal to a lower frequency more suitable for digital processing. The mixer 306 performs the down conversion using a local oscillator (LO) signal $F_c$. The mixer 306 gain is also controlled by the AGC module 332. The downconverted received signal is applied to an input of the first summer 308, which sums the received signal with a coarse DC compensation signal generated by the ADCL 340 and DAC 338 in order to reduce the DC component of the received signal at the output of the mixer 306. As previously discussed in the Background section, the LO signal leaking to the input of the mixer 306 and remixing with the LO signal produces a DC component at the output of the mixer 306. If not corrected, the DC component may propagate down the chain of modules of the front-end system 300.

The output of the first summer 308 is coupled to the ADC 310, which converts the received signal from analog to digital format. In particular, the AAF 312 filters the received analog signal to reduce or eliminate aliasing distortion, and the SDM 314 converts the filtered signal into digital format. The GD 316 delays the I-component and/or Q-component of the received signal to more equalize the timing relationship of the I/Q components. The DF 318 reduces or eliminates jamming and/or other unwanted signals from the received signal. The output of the DF 318 is applied to an input of the second summer 320, which sums the received signal with a fine DC compensation signal generated by the DDCL 330 in order to further reduce any DC residual remaining from the coarse DC compensation performed by the ADCL 340.

The output of the second summer 320 is applied to the NF 322, which reduces any unwanted higher-order harmonics of the received signal. The output of the NF 322 is applied to the I/Q mismatch compensating device 324, which better equalizes the gains and phases associated with the I- and Q-components. The output of the I/Q mismatch compensating device 324 is coupled to the FR 326, which corrects the received signal for unwanted frequency offset in the LO signal $F_c$. The output of the FR 326 is coupled to an input of the AGC module 332, which estimates the power level of the received RF signal at the input of the LNA 304, and generates the AGC signal for the LNA 304 and the digital gain control signal for the digital gain module 328. The AGC signal is also used by the DDCL 330 and ADCL 340 for adjusting the filtering of the signals from the second summer 320 and the DDCL 320, respectively. The output of the FR 326 is coupled to an input of the digital gain module 328, which applies gain to the received signal based on the digital gain control signal generated by the AGC module 332.

The AGC signal from the AGC module 332 may adjust the gain of the LNA 304 and/or mixer 306 in relatively large steps. For example, given a dynamic range for the received RF signal of −110 to −20 dBm, the AGC signal may provide the following five (5) analog gain stages for the LNA: 62 dB, 46 dB, 37 dB, 26 dB, and 10 dB. The digital gain control signal from the AGC module 332 provides finer gain adjustment for the received signal. The output of the digital gain module 342 is coupled to the digital signal processing module 342 for further processing of the received signal in order to obtain the data. The digital signal processing module 342 may provide the controller 344 signal timing information or lack thereof, which the controller 344 uses to control various modules of the front-end system 300. In particular, the controller 344 controls the AGC module 332, DDCL 330, ADCL 340, first switch SW1, and second switch SW2. The controller 344 may perform the controlling under the instructions of one or more software modules stored in a computer readable medium.

As previously discussed, the DDCL 330 provides fine adjustment (e.g., reduction or cancellation) of the DC component at the output of the second summer 320. In particular, the DDCL 330 includes an input coupled to the output of the second summer 320 in order to sense the received signal including the DC component. As discussed in more detail further herein, the DDCL 330 generates the fine DC compensation signal by performing a first-order filtering operation based on the gain state of the AGC signal. Also, as previously discussed, the ADCL 340 provides coarse adjustment (e.g., reduction or cancellation) of the DC component at the output of the first summer 308. In particular, the ADCL 340 includes an input coupled to the DDCL 330 via the switch SW2 to receive a signal therefrom related to the non-DC component of the received signal at the output of the second summer 320. As discussed in more detail further herein, the ADCL 340 generates the coarse DC compensation signal by performing a first-order filtering operation of the DDCL signal based on the gain state of the AGC signal.

Slow tracking mode (STM) means that the time constant of the DDCL 330 is configured relatively large (e.g., 102.4 μs in Connected mode) or conversely the bandwidth of the DDCL 330 is configured relatively small (e.g., 1.5 KHz). Fast tracking mode (FTM) means that the time constant of the DDCL 330 is configured relatively small (e.g., 6.4 μs in Acquisition mode and 1.6 μs in Sleep mode) or conversely the bandwidth of the DDCL 330 is configured relatively large (e.g., 25 KHz in Acquisition mode and 100 KHz in Sleep mode). More generally, STM means that DC compensation is performed slower than in FTM, or conversely, FTM means that DC compensation is performed faster than in STM.

As discussed in more detail herein, STM is used during the AT connected state as it provides an accurate static DC level estimation, but suffers from slow acquisition. However, FTM is suitable for acquiring fast static DC, but suffers from being relatively noisy. FTM is typically used during acquisition and sleep modes. However, it may also be used if the DC level or power estimation is significantly off. That is, if there are large fluctuations in the STM, then FTM may be invoked to re-establish a baseline. As mentioned above, the FTM does not provide an accurate DC level, but is helpful in providing a good initial estimate. It should also be noted that the DC level within the various circuit elements may arise as a function of the updating of the gain stages. That is, each gain stage may introduce a DC component when its mode/value of operation is changed. Therefore, DC compensation may include consideration of the circuit-introduced DC component. The above AGC/DC compensation design enables vast dynamic range accommodation and can be adjusted according to firmware control.

In modern communication systems, proper DC compensation of the input signal is a concern in order to best exploit the dynamic range available in the ADC. In the UMB standard, as one of several possible standards, the forward link signal strength can significantly vary except for within the superframe preamble (SFPA). Since the frame signal strength is subject to variation and the SFPA is the only stable power level reference, it poses a great challenge to existing systems trying to control the AGC within the SFPA window. Also, since the residual DC level of a zero IF receiver varies with the receiver gain settings, DC compensation should be performed when adjusting the AGC.

In various embodiments disclosed herein, the AGC and the DC compensation are controlled so that receiver gain is distributed in both the analog and digital domains, as well as the DC compensation being applied in both the analog and digital domains. The DC compensation setting is dependent on the AGC setting; that is, the DC compensation is re-adjusted whenever the analog gain state is changed due to the AGC.

Figure 4:
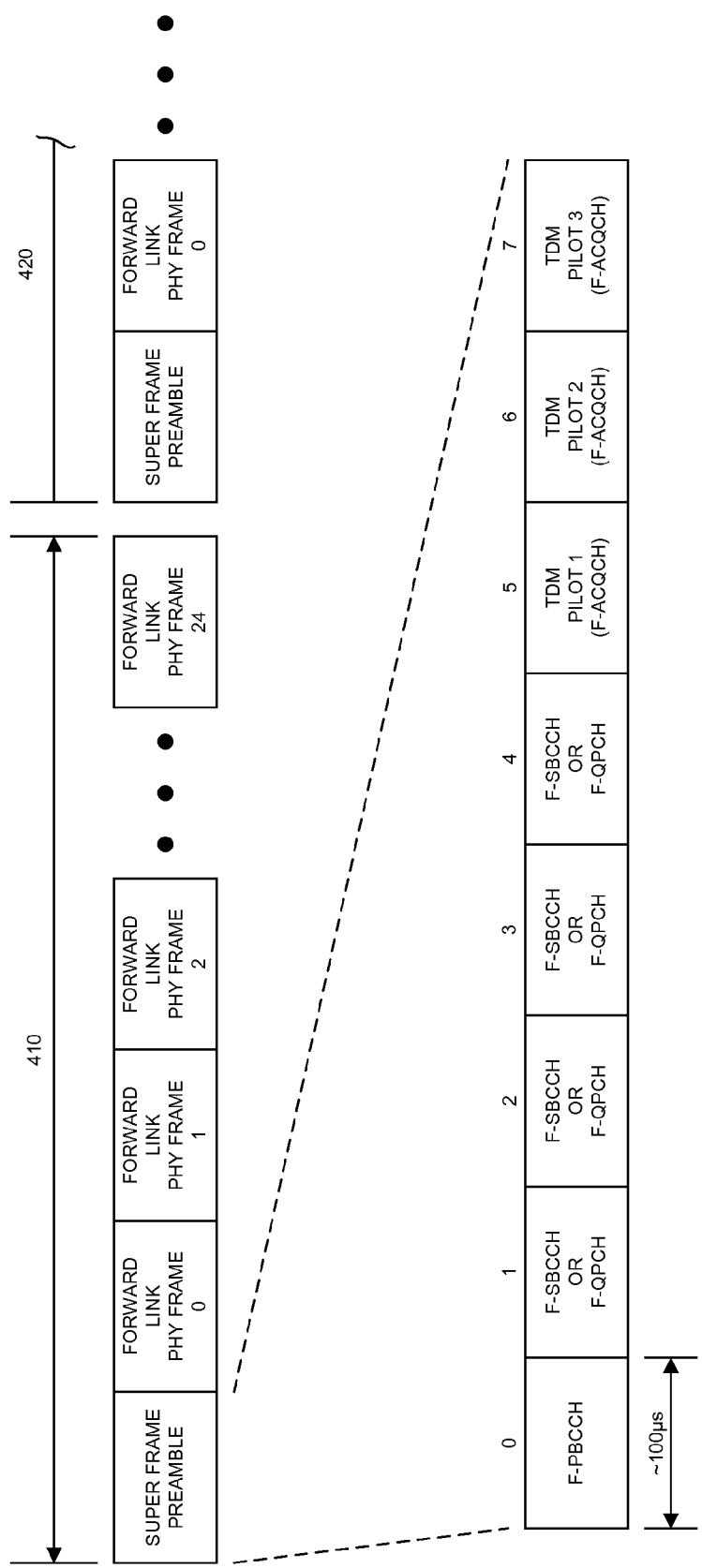
FIG. 4 illustrates a diagram of an Ultra Mobile Broadband (UMB) superframe structure according to another aspect of the disclosure.

FIG. 4 illustrates a diagram of an exemplary UMB superframe structure 410, which may be part of the received signal. The superframe 410 is shown containing a superframe preamble (SFPA). Subsequent to the SFPA, there are 25 forward link PHY frames indexed as 0-24, for example. A next superframe 420 is illustrated "following" the superframe 410, having a similar preamble and PHY frames.

Each SFPA includes eight (8) symbols with relevant information. Each symbol may be approximately 100 microseconds (μs). These symbols include the Forward-Primary Broadcast Channel (F-PBCCH), four (4) Forward-Secondary Broadcast Channels (F-SBCCH) or four (4) Forward-Quick Page Channels (F-QPCH), and three (3) time-division multiplexed (TDM) Pilots 1-3 (the Forward-Acquisition Channels (F-ACQCH)). For example, as further elaborated herein, updating of the AGC is performed during the reception of the F-PBCCH symbol, after this symbol has been decoded and/or with its associated power level. The 3-indexed OFDM symbol is not considered critical immediately after acquisition, therefore updating of the AGC can be performed immediately after acquisition. Also, the 5-7 indexed OFDM symbols are detected and decoded as a SFPA indicator and/or with power estimation, during acquisition, as the earlier symbols may be corrupted during the initial search. If the 5-7 indexed OFDM symbols are detected, then it can be confirmed that acquisition has occurred. However, the AGC power levels may be incorrect for this frame, therefore, AGC adjustments may be deferred till the next SFPA.

As apparent from the above discussion, to accommodate the sparse occurrences of SFPA for received signal strength (RSSI) measurements, the DC compensation and AGC timing parameters are carefully planned to meet system requirements. In this vein, five modes of operation are implemented.

DC compensation calibration mode;
Acquisition mode;
Acquisition-to-Connected mode transition;
Connected mode; and
Sleep mode.

DC compensation calibration mode is invoked at power up or any other times as desired by the system software (SW)/firmware (FW). DC compensation calibration is performed for all possible gain states with the antenna input zeroed out. Here a calibration table can be generated to offset or compensate for any DC component that is generated through the antenna circuitry. This mode can be performed during startup and can be a FW forced operation. The following describes an exemplary method of operating in the DC compensation calibration mode.

Figure 5:
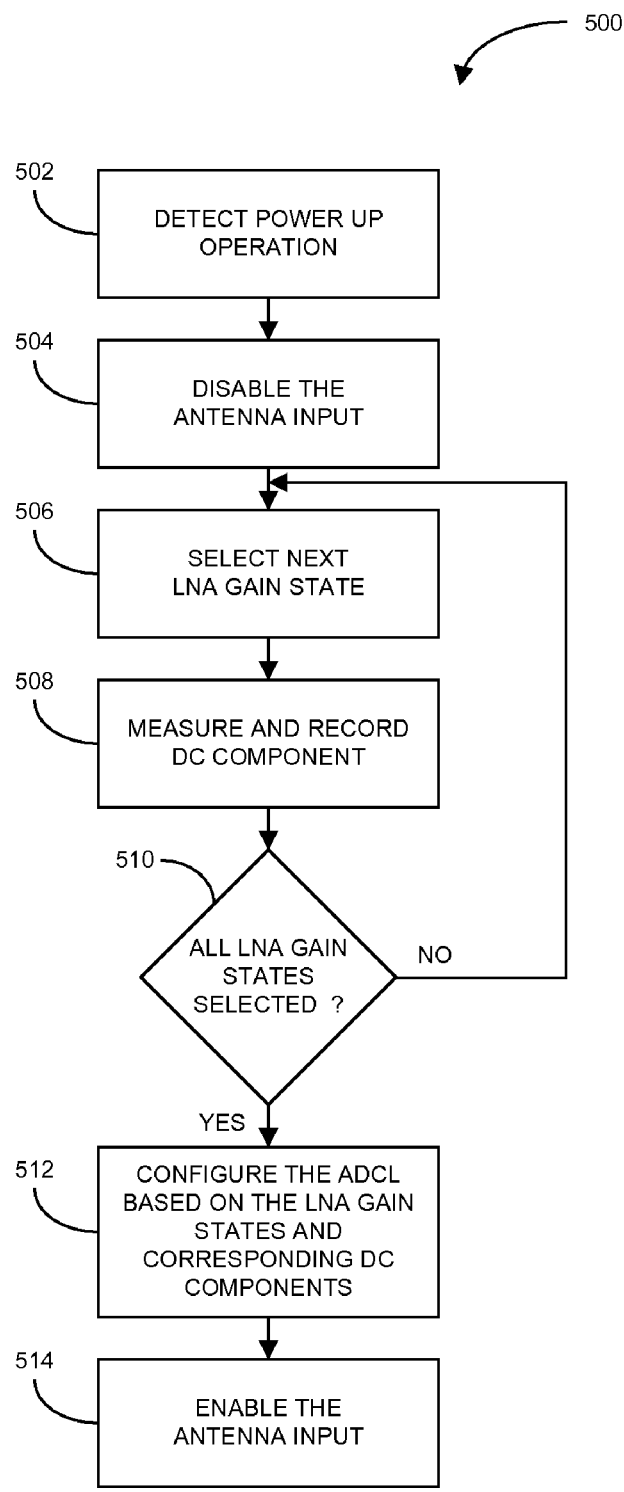
FIG. 5 illustrates a flow diagram of an exemplary method of calibrating the coarse DC compensation for all AGC states according to another aspect of the disclosure.

FIG. 5 illustrates a flow diagram of an exemplary method 500 of calibrating the coarse DC compensation (the ADCL) for all AGC states according to another aspect of the disclosure. According to the method 500, the controller 344 detects a power up operation of the access terminal (AT) (block 502). In response to detecting the power up operation, the controller 344 opens switch SW1 to disable the antenna 302 input to the LNA 304 so that the front-end 300 is not able to receive a signal (block 504). Then, the controller 344 controls the AGC module 332 to configure the LNA 304 in an initial gain state (block 506). Then, the controller 344 determines the DC component level at the output of the second summer 320 (block 508). Then, the controller 344 determines whether all of the gain states have been selected (block 510). If all of the LNA gain states have not been selected, the method proceeds back to block 506 to select the next gain state. Otherwise, the controller 344 configures the ADCL 340 so that it performs coarse DC compensation based on the measured DC components for all the gain states (block 512). Then, the controller 344 closes the switch SW1 so as to couple the antenna 302 to the LNA 304, so that the front-end 300 is able to receive a signal (block 514). This method may also apply in addition to, or alternatively, to the gain of the mixer 306.

Acquisition (ACQ) mode is used during initial acquisition or blind search. During initial acquisition, no system timing information is available to the access terminal (AT). In this case, the acquisition procedure is performed parallel to the AGC/DVGA adjustment. In TDD systems, and due to the absence of timing, the reverse link (RL) frame contributes to energy estimation leading to a large dynamic range of received energy. Add to that channel variations effects; therefore a fast tracking/update mode (FTM) that tries to follow closely energy variations in the signal is implemented. Another way of explaining this is that DC compensation is set to FTM mode. In each update cycle, DC compensation performs FTM update and the AGC conducts energy estimation (EE) or RSSI measurement until tracking is obtained. Once the access terminal (AT) acquires the timing, the superframe (SF) boundaries are well defined at this point, and the AGC/DVGA moves to the slow tracking mode (STM), subject to other conditions explained below.

Acquisition-to-Connected-Transition Mode: Once the access terminal (AT) has acquired the system time, the access terminal (AT) stops AGC operation until the next SFPA. At the start of the SFPA, the DC compensation and AGC run a series of (configurable) ACQ cycles, e.g., DC compensation FTM followed by EE/AGC update. Afterwards, it switches to Connected mode with DC compensation changed to STM mode with DC compensation coarse loop enabled. The following describes an exemplary method of operating in the acquisition and acquisition-to-connected-transition mode.

Figure 6:
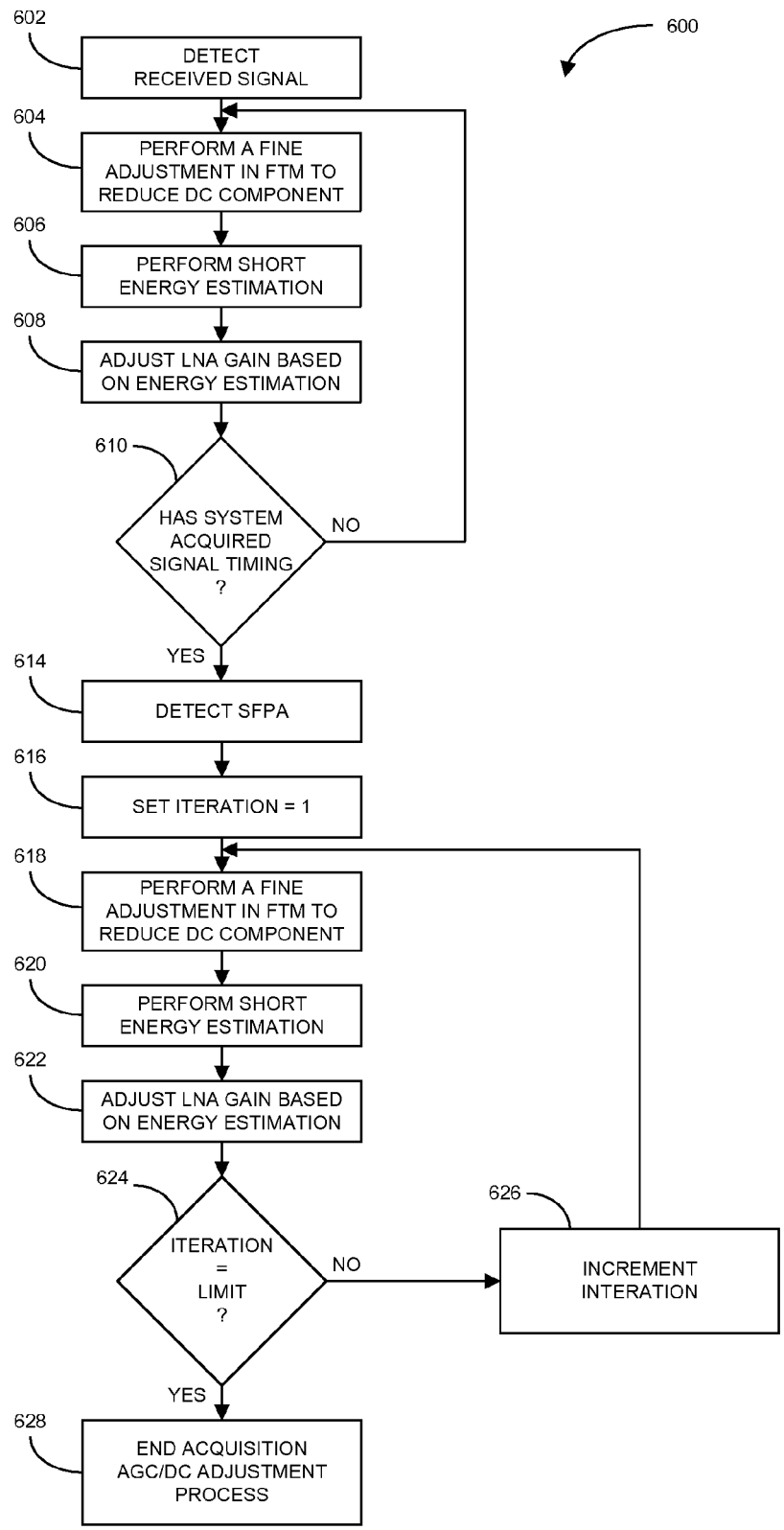
FIG. 6 illustrates a flow diagram of an exemplary method of performing AGC and DC level compensation in acquisition and acquisition-to-connected-transition modes according to another aspect of the disclosure.

FIG. 6 illustrates a flow diagram of an exemplary method 600 of performing AGC and DC level compensation in acquisition and acquisition-to-connected-transition modes according to another aspect of the disclosure. According to the method 600, the controller 344 detects that an RF signal is being received (block 602). In response to detecting the received signal, the controller 344 instructs the DDCL 330 to perform a fine adjustment in FTM (e.g., ~26 microseconds (µs) length operation) to reduce the DC component at the output of the second summer 320 (block 604). Then, the controller 344 instructs the AGC module 332 to perform a relatively short energy estimation (e.g., ~26 µs length operation) (block 606), and generates an AGC signal to adjust the gain of the LNA 304 (and/or the mixer 306) based on the energy estimation (e.g., ~6 µs length operation) (block 608). Then, the controller 344 determines whether the digital signal processing module 342 has acquired the timing of the received signal (block 610). If it has not, then the operations in blocks 604-610 are repeated.

If, on the other hand, the digital signal processing module 342 has acquired the timing of the received signal, it sends a signal to the controller 344 that it is processing the superframe preamble (SFPA) (block 614). Then, the controller 344 sets an iteration or count to one (1) (block 616). The controller 344 instructs the DDCL 330 to perform a fine adjustment in FTM (e.g., ~26 µs length operation) to reduce the DC component at the output of the second summer 320 (block 618). Then, the controller 344 instructs the AGC module 332 to perform a relatively short energy estimation (e.g., ~26 µs length operation) (block 620), and to generate an AGC signal to adjust the gain of the LNA 304 (and/or the mixer 306) based on the energy estimation (e.g., ~6 µs length operation) (block 622). The controller 344 then determines whether the iteration or count is equal to a predetermined limit (e.g., five (5) or six (6)) (block 624). If the iteration or count is not equal to the predetermined limit, the controller 344 increments the iteration or count (block 626). The controller 344 then repeats the operations of blocks 618 to 624. If, on the other hand, the controller 344 determines that the iteration or count is equal to the predetermined limit, the controller 344 ends the acquisition AGC/DC adjust processes (block 628).

Connected Mode entails two sub-modes: SFPA before PBCCH decode and SFPA after PBCCH decode.

First, a discussion of the general concept behind the "before" PBCCH decode mode is commenced, which starts with AGC energy estimation of the RSSI signal with DC compensation in slow tracking/update mode (STM) at the beginning of the 4th OFDM symbol of the SFPA. Afterwards, if the residual DC value crosses a pre-determined threshold, the operation switches from STM to FTM mode and begins to perform a pre-determined number of DC compensation coarse loop updates before switching the DC compensation back to STM.

Connected Mode for SFPA after PBCCH decode: We start AGC Energy Estimate (RSSI) with DC compensation in STM at the beginning of the first OFDM symbol of the SFPA. Afterwards, if the residual DC value crosses a pre-determined threshold, then we switch from STM to FTM mode and do a pre-determined number of DC compensation coarse loop updates before switching DC compensation back to STM.

In connected mode, there is the possibility of transmitting less than full power between preambles. Therefore, any update between two superframes can cause the ADC to saturate. For example, this may occur if an update is performed at a partial power frame followed by a full power frame. So, to avoid this pitfall, it is desired to update the superframe only during the preambles. It should be noted that the AGC may be running during the whole superframe(s), but is only updated during the preambles. Also, instead of locking to an instantaneous value, the AGC is locked to a filtered value. After ACQ, the instantaneous energy is calculated from other than the $1^{st}$-$3^{rd}$ symbols (0-$2^{nd}$ indexed) in the amplifier until PBCCH decoding, then from the first OFDM symbol afterwards. Here, it is presumed that timing has been accomplished. The following describes an exemplary method of operating in the connected mode.

Figure 7:
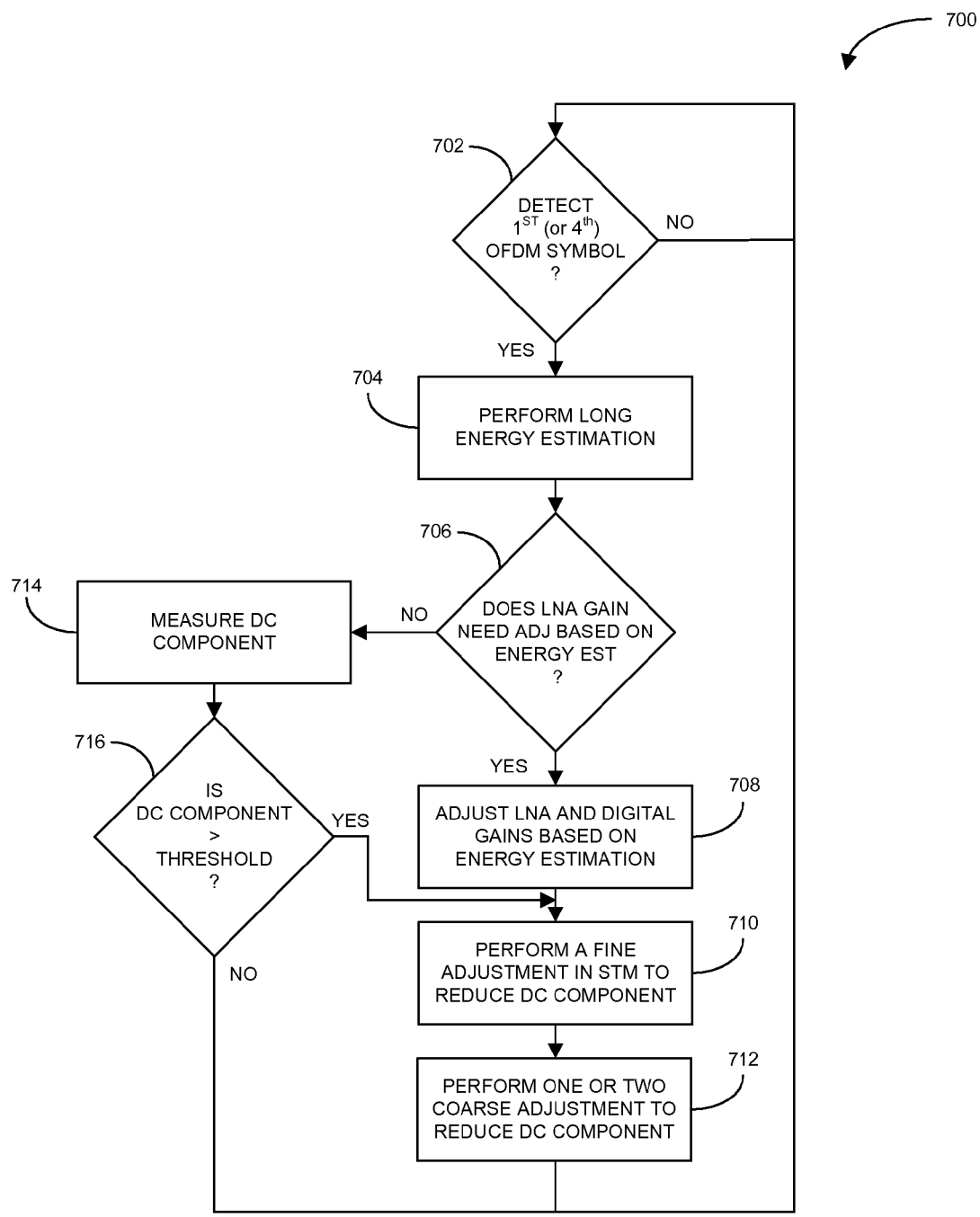
FIG. 7 illustrates a flow diagram of an exemplary method of performing AGC and DC level compensation in connected mode according to another aspect of the disclosure.

FIG. 7 illustrates a flow diagram of an exemplary method 700 of performing AGC and DC level compensation in connected mode according to another aspect of the disclosure. According to the method 700, the controller 344 receives a message from the digital signal processing module 342 indicating the detection of the first ($1^{st}$) OFDM symbol of the SFPA (if the PBCCH symbol has already been decoded) or the fourth ($4^{th}$) OFDM of the SFPA (if the PBCCH symbol has not yet been decoded) (block 702). If the corresponding symbol has not been detected, then controller 344 keeps on monitoring for the detection of this symbol per block 702. If the first ($1^{st}$) or fourth ($4^{th}$) symbol has been detected, the controller 344 instructs the AGC module 332 to perform a relatively long energy estimation of the received RF signal at the input to the LNA 304 (e.g., ~52 µs length operation) (block 704). Based on the energy estimation, the AGC module 332 determines whether the gain of the LNA 304 (and/or the mixer 306) needs to be adjusted (block 706). If it does, then the AGC module 332 generates an AGC signal to adjust the gain of the LNA 304 (and/or the mixer 306) based on the energy estimation (e.g., ~6 µs length operation). The method 700 then proceeds to operation depicted in block 710.

If the AGC module 332 determines that the gain of the LNA 304 (and/or the mixer 306) need not be adjusted in block 706, then the controller 344 determines the DC component at the output of the second summer 320 (block 714). Then, the controller 344 determines whether the DC component exceeds a predetermined threshold (block 716). If it does not, the controller 344 returns to the operation of block 702 to detect the first ($1^{st}$) or fourth ($4^{th}$) symbol of the next SFPA. If, on the other hand, the controller 344 determines that the measured DC component exceeds the predetermined threshold in block 716, the controller 344 instructs the DDCL 330 to perform a fine adjustment in STM to reduce the DC component at the output of the second summer 320 (e.g., ~6.5 µs length operation) (block 710). Then, the controller 344 instructs the ADCL 340 to perform one or two coarse adjustments to reduce the DC component at the output of the second summer 320 (e.g., ~6.5 µs length operation) (block 712). The controller 344 then returns to the operation of block 702 to detect the first ($1^{st}$) or fourth ($4^{th}$) symbol of the next SFPA.

Finally, Sleep Mode (Wakeup from Sleep): In this mode, the system wakes up at the beginning of the SFPA. Then, a DC update is performed in FTM and then perform EE. This procedure of DC/EE is repeated for a pre-determined number of cycles, upon which the process switches DC compensation to the STM mode. The following describes an exemplary method of operating in the sleep mode.

Figure 8:
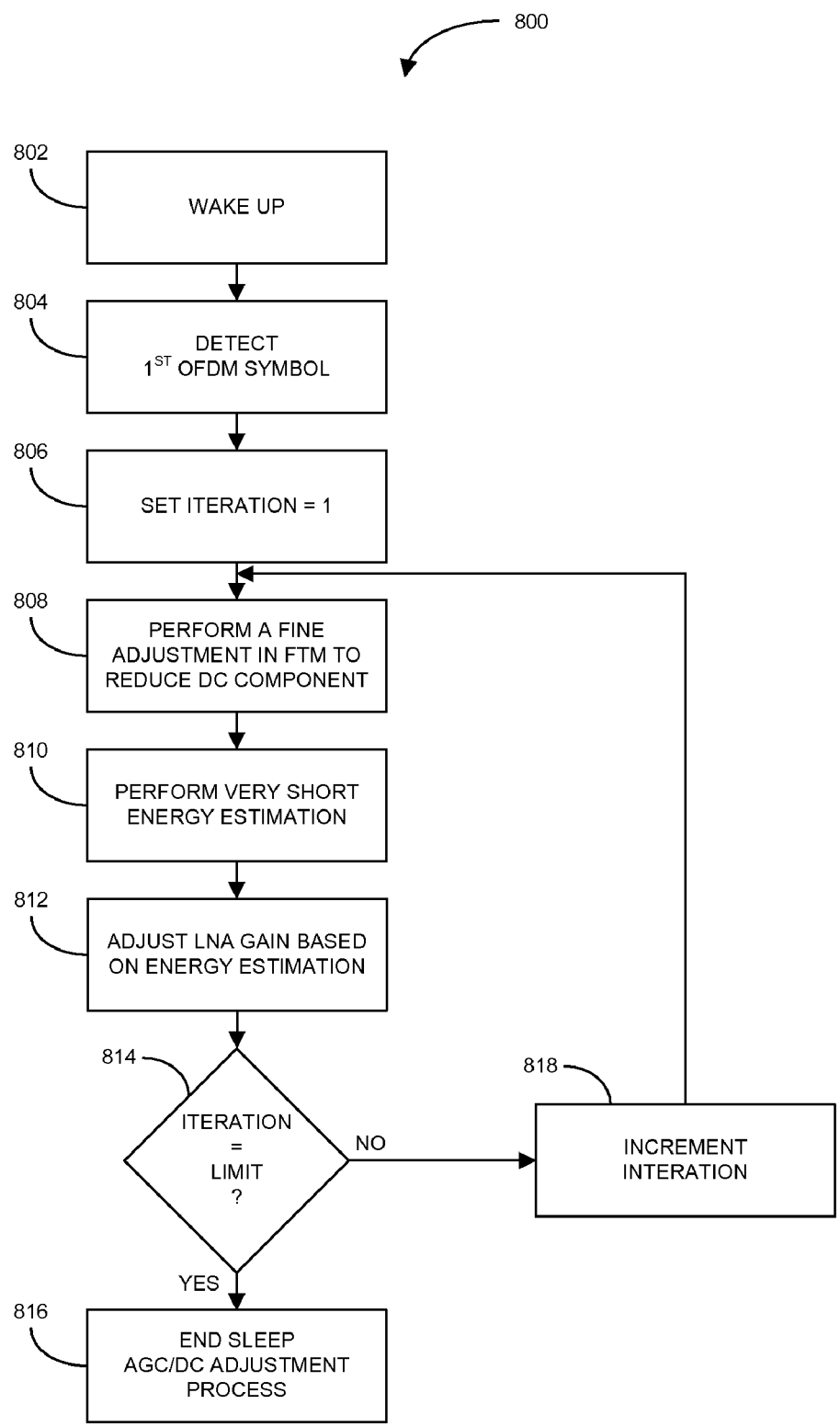
FIG. 8 illustrates a flow diagram of an exemplary method of performing AGC and DC level compensation in sleep mode according to another aspect of the disclosure.

FIG. 8 illustrates a flow diagram of an exemplary method 800 of performing AGC and DC level compensation in sleep mode according to another aspect of the disclosure. According to the method 800, the digital signal processing module 342 wakes up to check whether there is a page for the access terminal (AT) (block 802). After it has woke up, the digital signal processing module 342 detects the first ($1^{st}$) OFDM symbol of the SFPA (block 804). After being notified of the detection of the first ($1^{st}$) OFDM symbol, the controller 344 sets the iteration or count to one (1) (block 806). Then, the controller 344 instructs the DDCL 330 to perform a fine adjustment in FTM to reduce the DC component at the output of the second summer 320 (e.g., ~6.5 µs length operation) (block 808). Next, the controller 344 instructs the AGC module 332 to perform a relatively very short energy estimation (e.g., ~6.5 µs length operation) (block 810). The AGC module 332 then generates an AGC signal to adjust the gain of the LNA 304 (and/or the mixer 306) based on the energy estimation (e.g., ~6.5 µs length operation) (block 812). The controller 344 then determines whether the iteration or count equals a predetermined limit (e.g., five (5) or six (6)) (block 814). If it determines that the iteration or count does not equal the predetermined limit, the controller 344 increments the iteration or count (block 818), and repeats the operations in blocks 808 to 814. Otherwise, the controller 344 ends the sleep AGC/DC adjustment process (block 816).

Some of the rationales for the sequence of operations of the above modes are detailed herein. When acquisition cycle/timing is confirmed, fast tracking (FTM) is stopped until the next (second) superframe, at which fast tracking (FTM) is restarted for a pre-determined number of cycles in order to get a good initial estimate of the power setting in the preamble. It is understood that the first segments of the initial acquisition information may be corrupted or the power level for the first superframe preamble may be different than the next arriving (second) superframe preamble. Therefore, fast tracking is restarted at the next (second) superframe preamble (after timing has been acquired) in order to get a good initial power estimate. It is noted that AGC updates should not be performed between superframe preambles, but performed during the preambles, as the energy levels in the preambles are presumed to be constant.

However, because the $1^{st}$ symbol in the next (second) superframe preamble may also be corrupted or have a different power from that of the first superframe preamble, it is typically discarded. Because timing has been acquired, the fast tracking mode will quickly assess the power in the subsequent symbols in the next (second) superframe preamble. Thereafter, slow tracking mode (STM) can be performed.

With timing already acquired and power determined in the next (second) superframe preamble, the $1^{st}$ symbol of the preamble becomes irrelevant and updating of the AGC can now be performed on the $1^{st}$ symbol of the next (third) arriving superframe preamble.

Figure 9:
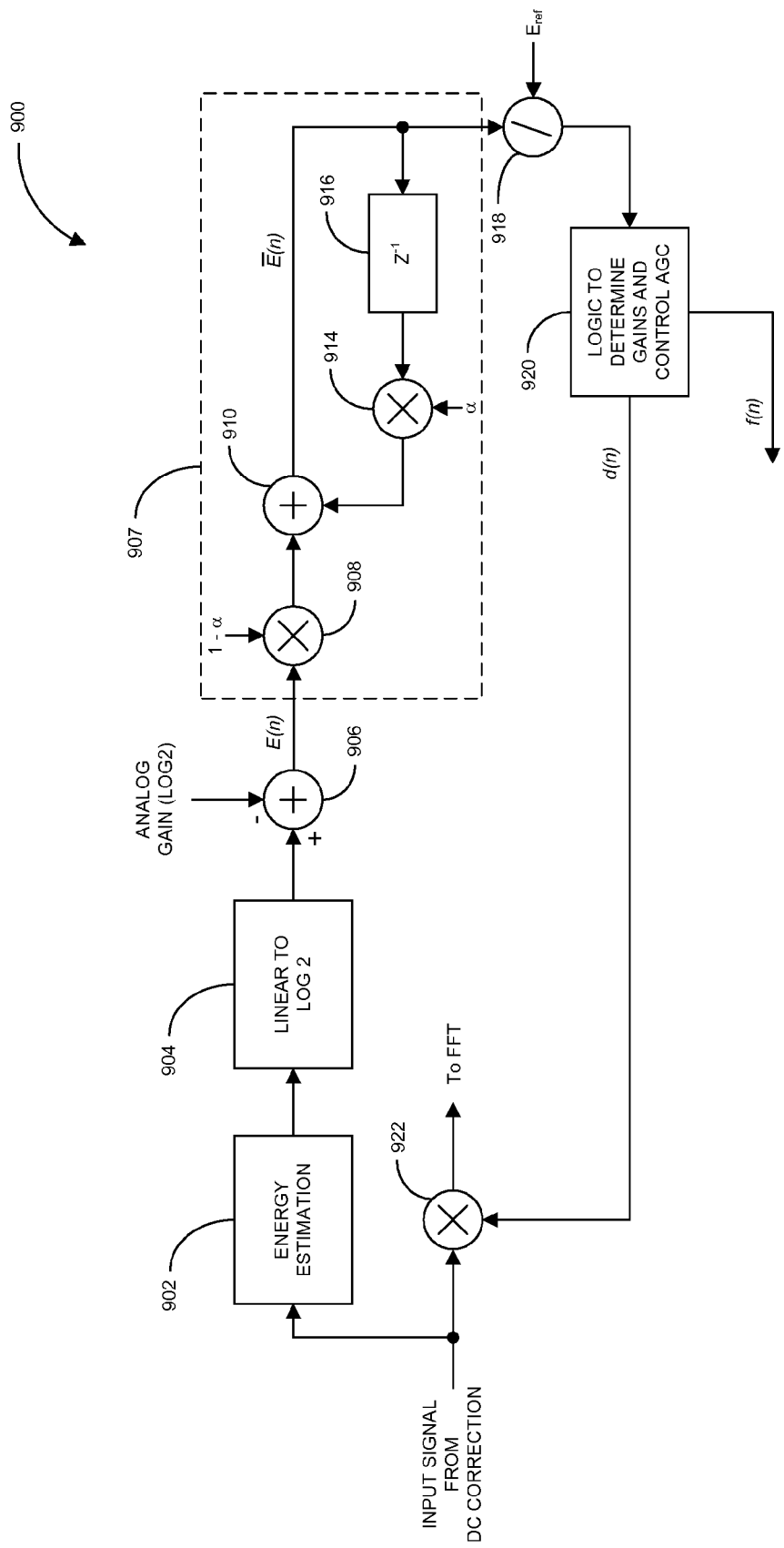
FIG. 9 illustrates a block diagram of exemplary automatic gain control (AGC) module according to another aspect of the disclosure.

FIG. 9 illustrates a block diagram of exemplary AGC module 900 according to another aspect of the disclosure. The AGC module 900 may be one exemplary implementation of the AGC module 332 (but further includes the digital gain module as item 922). The digital gain module 922 may be the same module 328 of front-end system 300, previously discussed.

In particular, the controller 900 comprises an energy estimator (EE) 902, a linear-to-log 2 transformer 904, a summer 906, a first ($1^{st}$) order filter 907, a divider/subtractor 918, and logic 920. The EE 902 receives the input signal from DC compensation/correction and forwards the signal to the transformer 904 to convert it to a log based format. The output of the transformer 904 is fed into the summer 906 having analog gain (log 2 format) as a reversed input. The analog gain (Log 2) estimates the gain between the antenna port to the input of the summer 906. Thus, the output of the summer 906 will be an updated energy estimate E(n) of the received RF signal at the antenna port.

The output of the summer 906 is applied to the first ($1^{st}$) order filter 907, which removes noise from the energy estimate E(n) of the received signal, and generate an average energy estimate $\bar{E}(n)$ of the received signal. The first ($1^{st}$) order filter 907 may, in turn, comprise a first multiplier 908, a summer 910, a delay element $Z^{-1}$ 916, and a second multiplier 914. The energy estimate E(n) of the received signal is applied to the first multiplier 908, which scales the estimate E(n) by a factor of 1−α. The scaled estimate is then applied to the summer 910, which sums it with a feedback signal from the output of the second multiplier 914. The average energy estimate $\bar{E}(n)$ of the received signal is generated at the output of the summer 910, which is applied to the input of the delay element $Z^{-1}$ 916. The output of the delay element t $Z^{-1}$ 916 is coupled to the second multiplier 914, which scales the delayed average energy estimate $\bar{E}(n)$ by a factor of α to generate the feedback signal.

The output of the filter 907 is fed into the divider/subtractor 918 (subtraction in log domain is equivalent to division in linear domain). A reference level or target level $E_{ref}$ is input into the divider/subtractor 918. The output of the divider/subtractor 918 provides a gain ratio result and is then fed into logic 920. Logic 920 has two outputs, one being digital gain signal d(n) for input into of the digital gain module 922 and one being analog gain signal f(n) for AGC control.

In summary, the DVGA operates on the energy signal after rejecting interference. The energy estimation is first scaled down by the current analog gain to obtain the received signal power level (before applying any gain). A first order loop is then used to estimate a filtered value of the power level. The control logic will select the corresponding analog gain stage by locating the RSSI. By using the arrangement shown in FIG. 9, it is possible to jump multiple analog gain stages in one update which provides faster AGC settling. It should be appreciated that various elements shown in FIG. 9 may be altered or changed according to design preference, while enabling the desired effective level of performance. Therefore, modifications may be made without departing from the spirit and scope of this and other embodiments.

Figure 10:
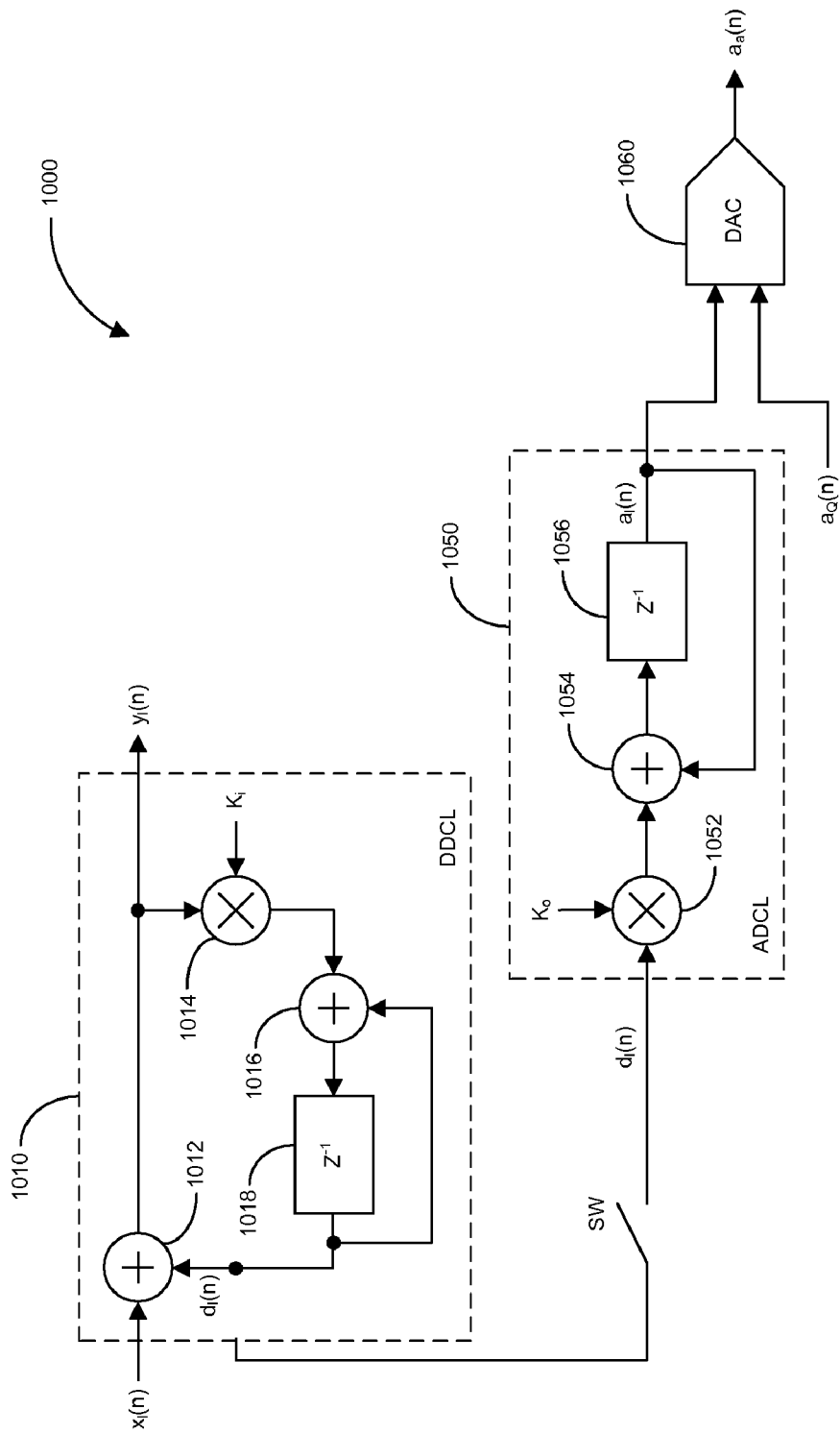
FIG. 10 illustrates a block diagram of exemplary direct current (DC) compensation loops according to another aspect of the disclosure.

FIG. 10 illustrates a block diagram of exemplary direct current (DC) compensation loops 1000 according to another aspect of the disclosure. Two loops are shown in 1000 representing feedback loops 1010 and 1050 with bandwidth control constants $K_i$ and $K_o$ as respective inputs. The first loop 1010 is considered a fine DC adjustment loop, while the second loop 1050 is considered a coarse DC adjustment loop.

In particular, the fine DC adjustment loop 1010 comprises a summer 1012 adapted to sum the signal $x_i(n)$ from the output of the second summer 320 with a feedback signal $d_i(n)$ to generate a DC compensation signal $y_i(n)$. The DC compensation signal $y_i(n)$ is applied to the multiplier 1014, which scales the signal by the bandwidth control constant $K_i$. The scaled signal is then applied to a summer 1016, which sums the scaled signal with a delayed output of the summer 1016 provided by delay element $Z^{-1}$ 1018. The feedback signal $d_i(n)$ is generated at the output of the delay element $Z^{-1}$ 1018.

The coarse DC adjustment loop 1050 comprises a multiplier 1052 adapted to multiply the feedback signal $d_i(n)$ from the fine DC adjustment loop 1010 with the bandwidth control constant $K_o$. The scaled signal is then applied to a summer 1054, which sums the scaled signal with the DC coarse compensation signal $a_i(n)$. The DC coarse adjustment signal $a_i(n)$ is generated by delaying the output of the summer 1054 using delay element $Z^{-1}$ 1056. The Q-DC coarse adjustment signal $a_i(n)$ is generated in a similar fashion. Both the I- and Q-DC coarse adjustment signal $a_i(n)$ and $a_Q(n)$ are applied to inputs of a DAC 1060, which generates the analog DC coarse adjustment signal $a_a(n)$.

It should be appreciated that the loop algorithms represented by the internal workings of the loops may be changed according to design preference. Therefore, while FIG. 10 illustrates one particular embodiment for DC loop design, other implementation may be used, wherein multiple loops or multiple degrees of granularity in control can be accomplished.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, changes in energy states, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An apparatus for processing a received radio frequency (RF) signal, comprising:
    an RF device for processing the received RF signal to generate a downconverted signal;
    an energy estimator coupled to the RF device for providing a signal related to an energy estimate of the received RF signal;
    an automatic gain control (AGC) module comprising the energy estimator and a digital variable gain amplifier (DVGA), the DVGA of the AGC module for controlling the gain of the RF device based on the energy estimate signal;
    a fine DC compensation module coupled to the RF device for performing fine adjustment of a DC component in the downconverted received signal, wherein a signal output from the DVGA of the AGC module controls the fine DC compensation module to perform the fine adjustment;
    a coarse DC compensation module coupled to the RF device for performing coarse adjustment of the DC component in the downconverted received signal, wherein a signal output from the DVGA of the AGC module controls the coarse DC compensation module to perform the coarse adjustment;
    an analog-to-digital converter (ADC) coupled to the RF device for converting the downconverted received signal from an analog domain to a digital domain; and
    a digital gain module coupled to the ADC and adapted to adjust the level of the downconverted received signal in the digital domain,
    wherein the AGC module is adapted to control the digital gain module based on the energy estimate signal.

2. The apparatus of claim 1, wherein the RF device comprises a low noise amplifier (LNA).

3. The apparatus of claim 1, wherein the RF device comprises a mixer.

4. The apparatus of claim 1, wherein the AGC module controls the gain of the RF device in a predetermined set of gains.

5. The apparatus of claim 1, wherein the fine DC compensation module performs fine adjustment of the DC component in the downconverted received signal in a fast tracking mode (FTM) or slow tracking mode (STM).

6. The apparatus of claim 1, wherein the fine DC compensation module performs fine adjustment of the DC component in the downconverted received signal in the digital domain.

7. The apparatus of claim 1, wherein the coarse DC compensation module performs coarse adjustment of the DC component in the downconverted received signal in the analog domain.

8. The apparatus of claim 3, further comprising a controller coupled to the coarse DC compensation module and adapted to configure the coarse DC compensation module based on a series of measurements of DC level from the AGC module corresponding to a series of gain states, when the RF received signal is not present.

9. An apparatus for processing a received radio frequency (RF) signal, comprising:
    an RF device for processing the received RF signal to generate a downconverted signal;
    an energy estimator coupled to the RF device for providing a signal related to an energy estimate of the received RF signal;
    an automatic gain control (AGC) module comprising the energy estimator and a digital variable gain amplifier (DVGA), the DVGA of the AGC module for controlling the gain of the RF device based on the energy estimate signal;
    a fine DC compensation module coupled to the RF device for performing fine adjustment of a DC component in the downconverted received signal, wherein a signal output from the DVGA of the AGC module controls the fine DC compensation module to perform the fine adjustment;

a coarse DC compensation module coupled to the RF device for performing coarse adjustment of the DC component in the downconverted received signal, wherein a signal output from the DVGA of the AGC module controls the coarse DC compensation module to perform the coarse adjustment;

a signal processing module coupled to the RF device for detecting timing information in the downconverted received signal; and a controller coupled to the signal processing module, wherein in response to the signal processing module not detecting the timing information in the downconverted received signal, the controller is adapted to perform one or more iterations of the following sequential operations:

instruct the fine DC compensation module to perform a fine adjustment in a fast tracking mode (FTM) of the DC component in the downconverted received signal;

instruct the energy estimator to generate an energy estimate of the received RF signal; and instruct the AGC module to control the gain of the RF device based on the energy estimate signal.

10. The apparatus of claim 9, wherein in response to the signal processing module detecting the timing information in the downconverted received signal, the controller is adapted to perform a predetermined number of one or more iterations of the following sequential operations:

instruct the fine DC compensation module to perform a fine adjustment in the FTM of the DC component in the downconverted received signal;

instruct the energy estimator to generate an energy estimate of the received RF signal; and instruct the AGC module to control the gain of the RF device based on the energy estimate signal.

11. An apparatus for processing a received radio frequency (RF) signal, comprising:

an RF device for processing the received RF signal to generate a downconverted signal;

an energy estimator coupled to the RF device for providing a signal related to an energy estimate of the received RF signal;

an automatic gain control (AGC) module comprising the energy estimator and a digital variable gain amplifier (DVGA), the DVGA of the AGC module for controlling the gain of the RF device based on the energy estimate signal;

a fine DC compensation module coupled to the RF device for performing fine adjustment of a DC component in the downconverted received signal, wherein a signal output from the DVGA of the AGC module controls the fine DC compensation module to perform the fine adjustment;

a coarse DC compensation module coupled to the RF device for performing coarse adjustment of the DC component in the downconverted received signal, wherein a signal output from the DVGA of the AGC module controls the coarse DC compensation module to perform the coarse adjustment;

a signal processing module coupled to the RF device for detecting timing information in the downconverted received signal; and a controller coupled to the signal processing module and adapted to perform the following sequential operations:

instruct the energy estimator to generate an energy estimate of the received RF signal in a timing relationship with the downconverted received signal; and instruct the AGC module to control the gain of the RF device based on the energy estimate signal in the timing relationship with the downconverted received signal.

12. The apparatus of claim 11, wherein the controller is further adapted to perform the following operations:

instruct the fine DC compensation module to perform a fine adjustment in a slow tracking mode (STM) of the DC component in the downconverted received signal in the timing relationship with the downconverted received signal; and instruct the coarse DC compensation module to perform a coarse adjustment of the DC component in the downconverted received signal in the timing relationship with the downconverted received signal.

13. The apparatus of claim 12, wherein the timing relationship comprises a time interval for the signal processing module to process at least a portion of a superframe preamble of the downconverted received signal.

14. An apparatus for processing a received radio frequency (RF) signal, comprising:

an RF device for processing the received RF signal to generate a downconverted signal;

an energy estimator coupled to the RF device for providing a signal related to an energy estimate of the received RF signal;

an automatic gain control (AGC) module comprising the energy estimator and a digital variable gain amplifier (DVGA), the DVGA of the AGC module for controlling the gain of the RF device based on the energy estimate signal;

a fine DC compensation module coupled to the RF device for performing fine adjustment of a DC component in the downconverted received signal, wherein a signal output from the DVGA of the AGC module controls the fine DC compensation module to perform the fine adjustment;

a coarse DC compensation module coupled to the RF device for performing coarse adjustment of the DC component in the downconverted received signal, wherein a signal output from the DVGA of the AGC module controls the coarse DC compensation module to perform the coarse adjustment;

a signal processing module coupled to the RF device for detecting timing information in the downconverted received signal; and a controller coupled to the signal processing module and adapted to perform the following operations if the DC component of the downconverted received signal exceeds a predetermined threshold:

instruct the fine DC compensation module to perform a fine adjustment in a slow tracking mode (STM) of the DC component in the downconverted received signal in a timing relationship with the downconverted received signal; and instruct the coarse DC compensation module to perform a coarse adjustment of the DC component in the downconverted received signal in the timing relationship with the downconverted received signal.

15. An apparatus for processing a received radio frequency (RF) signal, comprising:

an RF device for processing the received RF signal to generate a downconverted signal;

an energy estimator coupled to the RF device for providing a signal related to an energy estimate of the received RF signal;

an automatic gain control (AGC) module comprising the energy estimator and a digital variable gain amplifier (DVGA), the DVGA of the AGC module for controlling the gain of the RF device based on the energy estimate signal;

a fine DC compensation module coupled to the RF device for performing fine adjustment of a DC component in the downconverted received signal, wherein a signal output from the DVGA of the AGC module controls the fine DC compensation module to perform the fine adjustment;

a coarse DC compensation module coupled to the RF device for performing coarse adjustment of the DC component in the downconverted received signal, wherein a signal output from the DVGA of the AGC module controls the coarse DC compensation module to perform the coarse adjustment;

a signal processing module coupled to the RF device for detecting timing information in the downconverted received signal; and a controller coupled to the signal processing module and adapted to perform a predetermined one or more iterations of the following sequential operations:

instruct the fine DC compensation module to perform a fine adjustment in a fast tracking mode (FTM) of the DC component in the downconverted received signal in a timing relationship with the downconverted received signal;

instruct the energy estimator to generate an energy estimate of the received RF signal in the timing relationship with the downconverted received signal; and instruct the AGC module to control the gain of the RF device based on the energy estimate signal in the timing relationship with the downconverted received signal.

16. The apparatus of claim 15, wherein the timing relationship comprises a time interval for the signal processing module to process at least a portion of a superframe preamble of the downconverted received signal.

17. A method of processing a received radio frequency (RF) signal for adjusting a programmable power gain, comprising:

generating a signal related to an energy estimate of the received RF signal;

controlling the programmable power gain by amplifying a digital variable gain based on the energy estimate signal;

downconverting the received RF signal;

adjusting a DC component of the downconverted signal in a relatively fine manner, wherein the amplified digital variable gain controls the adjustment in the relatively fine manner;

adjusting the DC component of the downconverted signal in a relatively coarse manner, wherein the amplified digital variable gain controls the adjustment in the relatively coarse manner;

performing one or more iterations of the following sequential operations prior to detecting timing information in the downconverted signal:

adjusting the DC component of the downconverted signal in the relatively fine manner and in a fast tracking mode (FTM), generating the signal related to the energy estimate of the received RF signal, and controlling the programmable power gain based on the energy estimate signal; and detecting the timing information in the downconverted signal.

18. The method of claim 17, further comprising performing a predetermined number of one or more iterations of the following sequential operations after detecting the timing information in the downconverted signal:

adjusting the DC component of the downconverted signal in the relatively fine manner and in the FTM;

generating the signal related to the energy estimate of the received RF signal; and controlling the programmable power gain based on the energy estimate signal.

19. A method of processing a received radio frequency (RF) signal for adjusting a programmable power gain, comprising:

generating a signal related to an energy estimate of the received RF signal;

controlling the programmable power gain by amplifying a digital variable gain based on the energy estimate signal;

downconverting the received RF signal;

adjusting a DC component of the downconverted signal in a relatively fine manner, wherein the amplified digital variable gain controls the adjustment in the relatively fine manner;

adjusting the DC component of the downconverted signal in a relatively coarse manner, wherein the amplified digital variable gain controls the adjustment in the relatively coarse manner;

detecting timing information in the downconverted signal;

generating the signal related to the energy estimate of the received RF signal in a timing relationship with the downconverted signal; and controlling the programmable power gain based on the energy estimate signal in the timing relationship with the downconverted signal.

20. The method of claim 19, further comprising:

adjusting the DC component of the downconverted signal in the relatively fine manner and in a slow tracking mode (STM) in a timing relationship with the downconverted signal; and adjusting the DC component of the downconverted signal in the relatively coarse manner in the timing relationship with the downconverted signal.

21. The method of claim 20, wherein the timing relationship comprises a time interval for processing at least a portion of a superframe preamble of the downconverted signal.

22. A method of processing a received radio frequency (RF) signal for adjusting a programmable power gain, comprising:

generating a signal related to an energy estimate of the received RF signal;

controlling the programmable power gain by amplifying a digital variable gain based on the energy estimate signal;

downconverting the received RF signal;

adjusting a DC component of the downconverted signal in a relatively fine manner, wherein the amplified digital variable gain controls the adjustment in the relatively fine manner;

adjusting the DC component of the downconverted signal in a relatively coarse manner, wherein the amplified digital variable gain controls the adjustment in the relatively coarse manner;

detecting timing information in the downconverted signal; and performing a predetermined number of one or more iterations of the following sequential operations:

adjusting the DC component of the downconverted signal in the relatively fine manner and in a fast tracking mode (FTM) in a timing relationship with the downconverted signal;

generating the signal related to the energy estimate of the received RF signal in the timing relationship with the downconverted signal; and controlling the programmable power gain based on the energy estimate signal in the timing relationship with the downconverted signal.

23. The method of claim 22, wherein the timing relationship comprises a time interval for processing at least a portion of a superframe preamble of the downconverted signal.

24. An apparatus for processing a received radio frequency (RF) signal for adjusting a programmable power gain, comprising:

means for generating a signal related to an energy estimate of the received RF signal;

means for controlling the programmable power gain by amplifying a digital variable gain based on the energy estimate signal;

means for downconverting the received RF signal;

means for adjusting a DC component of the downconverted signal in a relatively fine manner, wherein the amplified digital variable gain controls the adjustment in the relatively fine manner;

means for adjusting the DC component of the downconverted signal in a relatively coarse manner, wherein the amplified digital variable gain controls the adjustment in the relatively coarse manner;

means for controlling the following in a sequential order prior to detecting timing information in the downconverted signal:
means for adjusting the DC component of the downconverted signal in the relatively fine manner and in a fast tracking mode (FTM),
means for generating the signal related to the energy estimate of the received RF signal, and
means for controlling the programmable power gain based on the energy estimate signal; and means for detecting the timing information in the downconverted signal.

25. An apparatus for processing a received radio frequency (RF) signal for adjusting a programmable power gain, comprising:

means for generating a signal related to an energy estimate of the received RF signal;

means for controlling the programmable power gain by amplifying a digital variable gain based on the energy estimate signal;

means for downconverting the received RF signal;

means for adjusting a DC component of the downconverted signal in a relatively fine manner, wherein the amplified digital variable gain controls the adjustment in the relatively fine manner;

means for adjusting the DC component of the downconverted signal in a relatively coarse manner, wherein the amplified digital variable gain controls the adjustment in the relatively coarse manner;

means for detecting timing information in the downconverted signal; and means for controlling the following in a timing relationship with the downconverted signal after the timing information in the downconverted signal is detected:

means for generating the signal related to the energy estimate of the received RF signal in the timing relationship with the downconverted signal; and means for controlling the programmable power gain based on the energy estimate signal in the timing relationship with the downconverted signal.

26. The apparatus of claim 25, wherein the controlling means additionally controls the following in the timing relationship with the downconverted signal after the timing information in the downconverted signal is detected:

means for adjusting the DC component of the downconverted signal in the relatively fine manner and in a slow tracking mode (STM); and means for adjusting the DC component of the downconverted signal in the relatively coarse manner.

27. An apparatus for processing a received radio frequency (RF) signal for adjusting a programmable power gain, comprising:

means for generating a signal related to an energy estimate of the received RF signal;

means for controlling the programmable power gain by amplifying a digital variable gain based on the energy estimate signal;

means for downconverting the received RF signal;

means for adjusting a DC component of the downconverted signal in a relatively fine manner, wherein the amplified digital variable gain controls the adjustment in the relatively fine manner;

means for adjusting the DC component of the downconverted signal in a relatively coarse manner, wherein the amplified digital variable gain controls the adjustment in the relatively coarse manner;

means for detecting timing information in the downconverted signal; and means for controlling a predetermined one or more iterations of the following in a timing relationship with the downconverted signal:

means for adjusting the DC component of the downconverted signal in the relatively fine manner and in a fast tracking mode (FTM);

means for generating the signal related to the energy estimate of the received RF signal; and means for controlling the programmable power gain based on the energy estimate signal.

28. A computer readable program product for processing a received radio frequency (RF) signal for adjusting a programmable power comprising a computer-readable medium having instructions stored thereon, the instructions being executable by one or more processors and comprising:

instructions for generating a signal related to an energy estimate of the received RF signal;

instructions for controlling the programmable power gain by amplifying a digital variable gain based on the energy estimate signal;

instructions for downconverting the received RF signal;

instructions for adjusting a DC component of the downconverted signal in a relatively fine manner, wherein the amplified digital variable gain controls the adjustment in the relatively fine manner;

instructions for adjusting the DC component of the downconverted signal in a relatively coarse manner, wherein the amplified digital variable gain controls the adjustment in the relatively coarse manner;

instructions for detecting timing information in the downconverted signal;

instructions for generating the signal related to the energy estimate of the received RF signal in a timing relationship with the downconverted signal; and instructions for controlling the programmable power gain based on the energy estimate signal in the timing relationship with the downconverted signal.

* * * * *